(12) United States Patent
Hahn et al.

(10) Patent No.: US 8,570,688 B1
(45) Date of Patent: Oct. 29, 2013

(54) ELECTRICAL CONNECTIONS TO A MICROACTUATOR IN A HARD DISK DRIVE SUSPENSION

(75) Inventors: Peter Hahn, Wildomar, CA (US); Kuen Chee Ee, Chino, CA (US)

(73) Assignee: Magnecomp Corporation, Murrieta, CA (US)

( * ) Notice: Subject to any disclaimer, the term of this patent is extended or adjusted under 35 U.S.C. 154(b) by 125 days.

(21) Appl. No.: 13/287,094

(22) Filed: Nov. 1, 2011

Related U.S. Application Data

(60) Provisional application No. 61/411,357, filed on Nov. 8, 2010.

(51) Int. Cl.
*G11B 5/55* (2006.01)
*G11B 21/24* (2006.01)

(52) U.S. Cl.
USPC ............... 360/294.4; 360/264.3; 360/244.5

(58) Field of Classification Search
USPC .......... 360/245.9, 264.2, 294.6, 294.4, 244.5, 360/264.3, 264.4, 264.5
See application file for complete search history.

(56) References Cited

U.S. PATENT DOCUMENTS

| | | | | |
|---|---|---|---|---|
| 4,935,803 A * | 6/1990 | Kalfus et al. | ................ | 257/673 |
| 5,259,767 A * | 11/1993 | Kurbikoff et al. | ............. | 439/59 |
| 5,867,347 A * | 2/1999 | Knight et al. | ............. | 360/294.5 |
| 6,211,603 B1 | 4/2001 | Iino et al. | | |
| 7,218,481 B1 * | 5/2007 | Bennin et al. | ............. | 360/294.4 |
| 7,365,944 B2 | 4/2008 | Fujimoto et al. | | |
| 7,459,835 B1 | 12/2008 | Mei et al. | | |
| 7,532,438 B1 * | 5/2009 | Mei et al. | ................ | 360/245.8 |
| 7,751,153 B1 | 7/2010 | Kulangara et al. | | |
| 8,144,435 B2 * | 3/2012 | Greminger et al. | ........ | 360/294.4 |
| 8,189,301 B2 * | 5/2012 | Schreiber | ................ | 360/294.4 |
| 8,254,062 B2 * | 8/2012 | Greminger | ................ | 360/244.5 |
| 2007/0109690 A1 * | 5/2007 | Yao et al. | ................ | 360/294.4 |
| 2009/0086379 A1 | 4/2009 | Hanya et al. | | |
| 2009/0323225 A1 | 12/2009 | Toffle et al. | | |
| 2010/0177445 A1 | 7/2010 | Fuchino | | |
| 2011/0249366 A1 * | 10/2011 | Fujimoto et al. | ........... | 360/294.4 |
| 2011/0317309 A1 * | 12/2011 | Shum et al. | ................ | 360/99.08 |

OTHER PUBLICATIONS

Hyman, D et al., "Contact Physics of Gold Micro-Contacts for MEMS Switches," IEEE Transactions on Components and Packaging Tech., vol. 22, No. 3 (Sep. 1999).
Amp Incorporated Technical Report, "Golden Rules: Guidelines for the Use of Gold on Connector Contacts" (2004).

(Continued)

*Primary Examiner* — Brian Miller
(74) *Attorney, Agent, or Firm* — Intellectual Property Law Office of Joel Voelzke, APC

(57) ABSTRACT

In a disk drive suspension circuit, an electrical contact from a flexible circuit to a face of a PZT microactuator is provided by a mechanical bias to press a contact pad of the flexible circuit against the PZT surface. The mechanical bias is provided by a piece of stainless steel that is welded to a nearby point or points on the suspension, and which biases the electrical contact pad carrying the PZT driving voltage against the PZT. The piece of stainless steel may be in the form of a flat piece welded on one or more sides of the contact pad, and may include a dimple for pressing against the contact pad. Additional insulation material may be provided between the dimple and the contact pad to prevent the dimple from penetrating through the flexible circuit's cover layer and shorting the driving voltage.

19 Claims, 5 Drawing Sheets

(56) References Cited

OTHER PUBLICATIONS

Horn, Jochen et al., "Avoiding Fretting Corrosion by Design," AMP Journal of Technology, vol. 4 (Jun. 1995).
Van Dijk, Piet, "Contact Spots," Proc. 20th Conf. on Electrical Contacts ICEC (2000).
Bock, E.M. et al., "Fretting Corrosion in Electrical Contacts", 20th Annual Holm Seminar on Electrical Contacts (Oct. 1974).
Zhu, Deng-Lin, "Topology Design to Improve HDD Suspension Dynamic Characteristics," Struct Multidisc. Optim. 31:497-503 (2006).
Becker, H. et al., "Gold Contact Resistance," Gold. Bull. vol. 15, No. 3 (1982).

* cited by examiner

ELECTRICAL CONNECTIONS TO A MICROACTUATOR IN A HARD DISK DRIVE SUSPENSION

CROSS-REFERENCE TO RELATED APPLICATIONS

This application claims priority from U.S. provisional patent application Ser. No. 61/411,357 filed Nov. 8, 2010, which is incorporated by reference as if fully set forth herein.

BACKGROUND OF THE INVENTION

1. Field of the Invention

This invention relates to the field of dual stage actuator (DSA) type suspensions for disk drives including hard disk drives. More particularly, this invention relates to the field of electrical connections to microactuators in a hard disk drive suspension, particularly to piezoelectric microactuators.

2. Description of Related Art

Magnetic hard disk drives and other types of spinning media drives such as optical disk drives are well known. FIG. 1 is an oblique view of an exemplary prior art hard disk drive and suspension for which the present invention is applicable. The prior art disk drive unit 100 includes a spinning magnetic disk 101 containing a pattern of magnetic ones and zeroes on it that constitutes the data stored on the disk drive. The magnetic disk is driven by a drive motor (not shown). Disk drive unit 100 further includes a disk drive suspension 105 to which a magnetic head slider (not shown) is mounted proximate a distal end of load beam 107. Suspension 105 is coupled to an actuator arm 103, which in turn is coupled to a voice coil motor 112 that moves the suspension 105 arcuately in order to position the head slider over the correct data track on data disk 101. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only voice coil motor 112 moves suspension 105.

In a DSA suspension, as for example in U.S. Pat. No. 7,459,835 issued to Mei et al. as well as many others, in addition to voice coil motor 112 which moves the entire suspension, at least one microactuator is located on the suspension in order to effect fine movements of the magnetic head slider to keep it properly aligned over the data track on the spinning disk.

In a DSA suspension, the microactuator(s) provide much finer control and much higher bandwidth of the servo control loop than does the voice coil motor alone, which effects relatively coarse movements of the suspension and hence the magnetic head slider. DSA suspensions carry the disadvantages, however, of higher piece count and greater assembly costs. The most expensive additional part used in DSA suspensions is the microactuator itself, which is typically a flat piece of piezoelectric crystal, typically lead zirconate titanate (PZT), and its associated manufacturing challenges. The negative side, or the V− or ground terminal, of the PZT microactuator is typically adhered onto the suspension using conductive epoxy. The stainless steel surface of the suspension base plate or other stainless steel part typically provides the ground contact for the PZT. The positive side, or the V+ terminal, of the PZT is often connected to a wire or other conductor carrying a driving voltage by conductive epoxy. Such a connection can be time consuming to make and/or requires special bonding equipment. Additionally, the use of conductive epoxy from the PZT positive electrode to the PZT driving voltage conductor can introduce potentially contaminating epoxy particles into the disk drive assembly process, and presents additional manufacturing complications. The bonding process also increases process time, and it can be difficult to maintain manufacturing consistency.

Soldered connections have also been used, typically to provide the driving voltage connection from the V+ electrode of the PZT to a flexible electrical conductor such as a short length of wire. The wire and its connection to the PZT is sometimes referred to as a tail weave. Tail weaves are typically constructed using exacting and hence expensive skilled labor.

FIG. 2 is a top plan view of suspension 105 of FIG. 1, which is a representative prior art DSA suspension, and FIG. 3 is a close-up view thereof in the area around microactuators 114. Two PZT microactuators 114 are affixed to suspension 105 on microactuator mounting shelves 118 that are formed within base plate 103, such that PZTs 114 span respective gaps in base plate 103. PZT Microactuators 114 expand and contract thereby effecting fine movements of load beam 107 and the magnetic head slider mounted at the distal end of the load beam. Microactuators 114 are firmly held within the cavity on mounting shelves 118 by non-conductive epoxy 116 at each end of the microactuators 114. The positive and negative electrical connections can be made from the PZTs to the suspension's flexible wiring trace and/or to the grounded base plate by a variety of techniques including those disclosed in commonly owned U.S. Pat. No. 7,751,153 to Kulangara et al. especially FIG. 7B, U.S. Patent Publication No. 2010/0177445 by Fuchino, and U.S. Patent Publication No. US 2009/0086379 by Hanya et al. An exemplary electrical connection to the positive terminal or face 122 of PZT 114 can be seen in FIG. 3. The negative (ground) electrical connection is usually made from the negative terminal or face of PZT 114 to baseplate 103 using conductive epoxy (not shown). The PZTs can be located in various locations within the suspension including on cavities within baseplate 105, on the load beam 107, or at or near the head gimbal assembly which is located at the distal end of load beam 107. Many variations have been proposed and/or implemented.

SUMMARY OF THE INVENTION

The present invention is of an electrical connection to a PZT microactuator that uses a resilient material and pressure rather than soldering or conductive adhesive to establish sufficient electrical contacts to the PZT microactuators for use in hard disk drives.

In an illustrative embodiment, a stainless steel piece containing a spring finger and/or a resilient dimple is welded to the stainless steel body of the suspension in the area of the suspension's PZT microactuator(s). The additional piece pushes an electrical contact pad that forms part of the suspension's circuit against the PZT surface with sufficient force to maintain electrical contact with the PZT. Preferably, both the PZT surface and the electrical contact pad are coated with gold, and have a thin layer of electrical contact enhancing and friction reducing material between them such as electrically conductive grease. Because a standard suspension assembly process includes stainless steel welding such as laser welding, welding the additional piece to the assembly utilizes an already existing process step and thus can be accomplished quickly and easily into standard assembly processes without introducing any additional process step. The invention thus allows the elimination of the expensive tail weave process step, and at least partially eliminates the conductive epoxy bonding step(s) previously used.

In one aspect therefore, the invention is of a dual stage actuator (DSA) type suspension for a disk drive having a microactuator for effecting fine movements of the load beam and in particular the magnetic read/write head mounted to the distal end of the load beam, a microactuator, an electrical contact pad that carries a driving voltage and that extends from the suspension's flexible circuit over the microactuator, and a means for biasing the electrical contact pad up against the microactuator's driving voltage electrode or surface. The bias means can be a resilient piece such as a stainless steel spring that is welded to a nearby portion of the suspension body such as by laser welding, laser welding already being a commonly used process step in suspension assembly. Alternatively, or additionally, the bias means can have a dimple that may either be formed into the spring such as by stamping, or it can have a dimple of a different material that is itself resilient and itself constitutes a spring that supplies the bias force. Preferably the microactuator surface and the electrical contact are coated with gold and/or other corrosion resistant metal(s), and a thin layer of electrically conductive grease is applied between the contact pad and the microactuator surface to help ensure that the point of contact between the two surfaces will remain free of galvanic corrosion and oxidation, and also free of mechanical fretting. Preferably a thin sheet of mechanically strong and non-conductive material is interposed between the dimple and the electrical contact pad to help protect the thin contact pad from being penetrated or otherwise damaged by the dimple pressing down against the contact pad. The mechanically biased contact between the contact pad and the microactuator replaces the soldering or conductive epoxy previously used in prior art suspensions to connect the positive voltage lead from the flexible circuit to the microactuator's positive terminal. The spring can be either a separate piece that is laser welded to the suspension, or it could be integrally formed with part of the suspension body.

Optionally, the suspension can have a second and similar mechanically biased contact to the grounding surface of the microactuator that can replace various grounding configurations in prior art suspensions that relied on conductive epoxy. In particular, a second piece, having either spring-like characteristics and being biased against the microactuator and/or having a resilient dimple, can provide the grounding contact to the microactuator's negative or grounding terminal. The second piece or spring pressing up against the microactuator can thus form a ground contact to the suspension's grounded stainless steel body.

Exemplary embodiments of the invention will be described below with reference to the drawings, in which like numbers refer to like parts. The drawing figures might not be to scale, and certain components may be shown in generalized or schematic form and identified by commercial designations in the interest of clarity and conciseness.

DETAILED DESCRIPTION

For discussion purposes, the present disclosure will refer to the microactuator as being a "PZT," although it will be understood that other types of microactuators could be used as well, and thus the invention is applicable to DSA suspensions using other types of micro actuators.

According to the invention, electrical connections can be made to the PZT using biased mechanical contacts rather than the previously employed soldered contacts or adhesive contacts.

Figure 1:
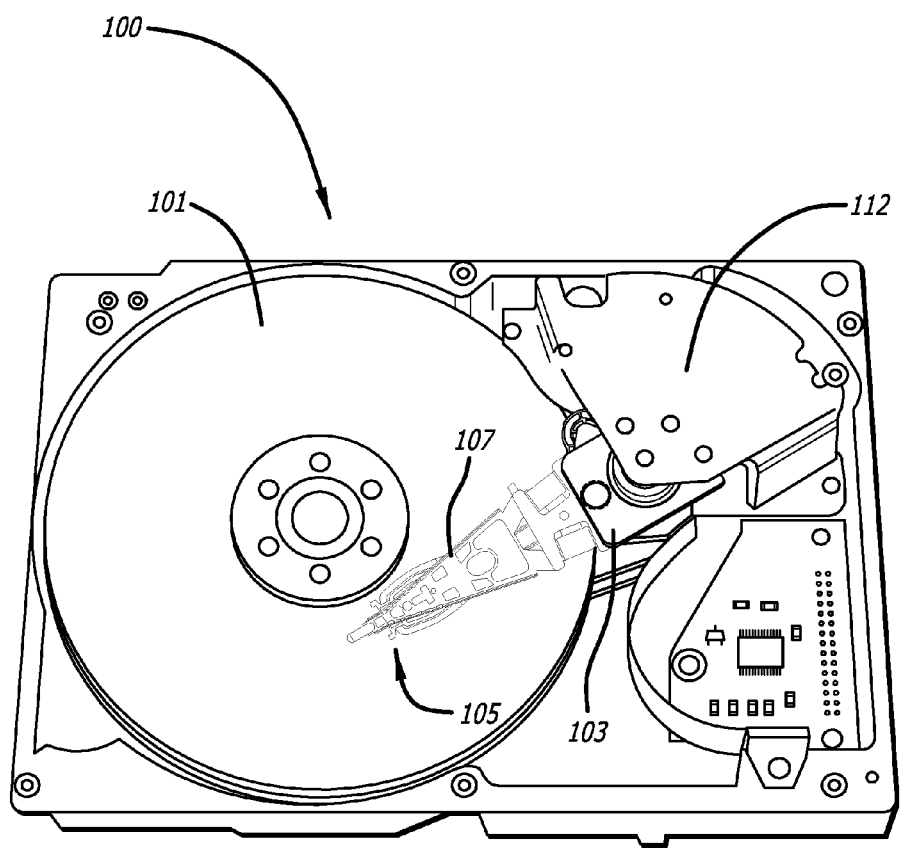
FIG. 1 is an oblique view of a prior art hard disk drive assembly to which the present invention is applicable.
Figure 2:
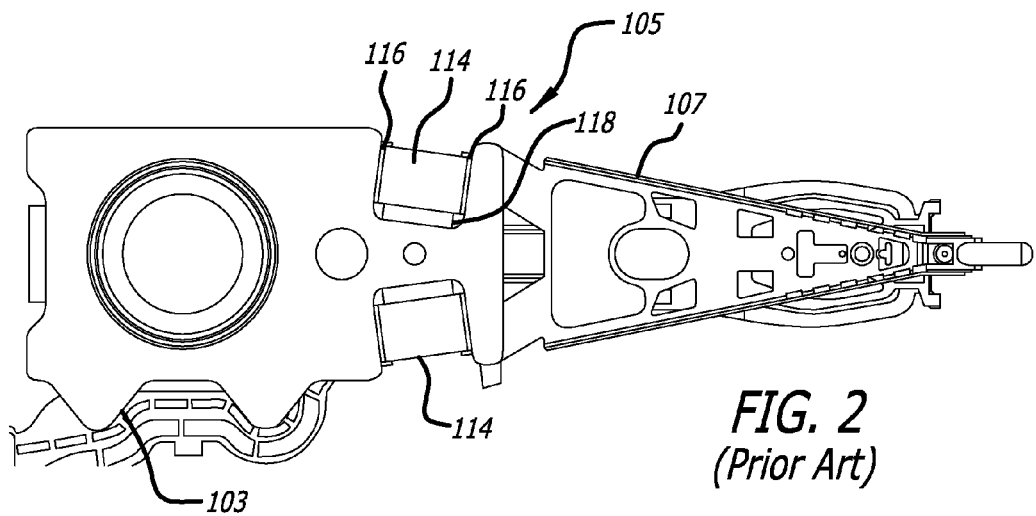
FIG. 2 is a top plan view of the suspension 105 of FIG. 1.
Figure 3:
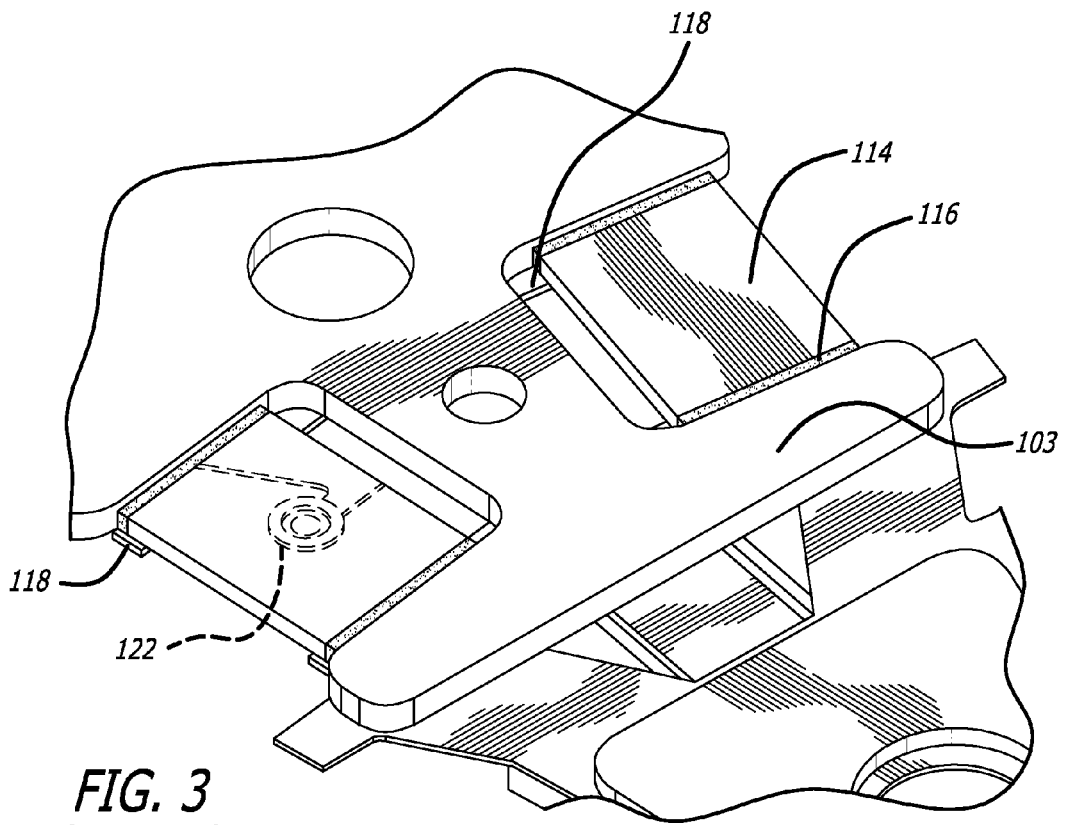
FIG. 3 is a close-up oblique view of the suspension 105 of FIG. 2.
Figure 4:
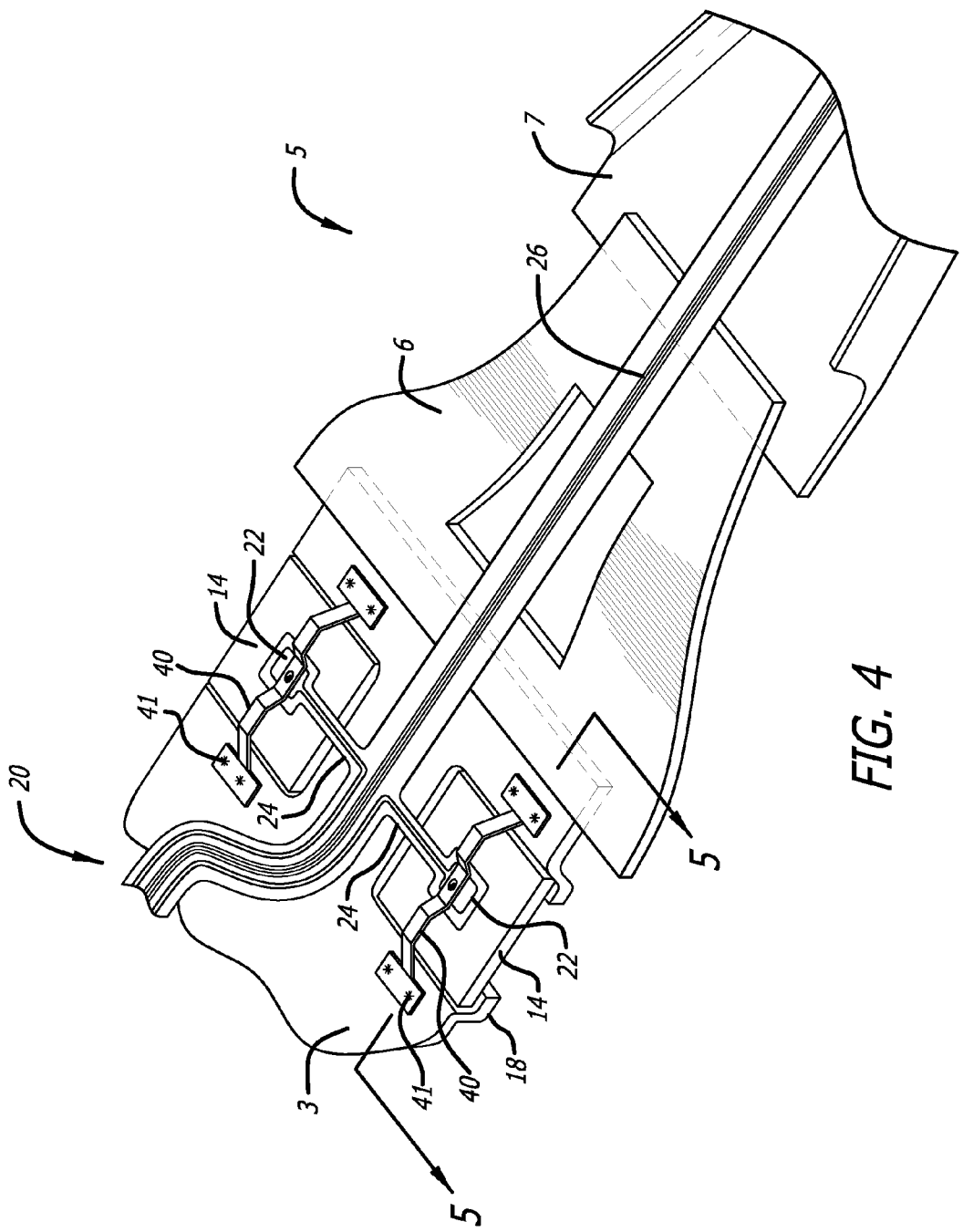
FIG. 4 is an oblique view of an embodiment of the present invention.

FIG. 4 is an oblique view from what will be referred to as the top of the suspension for discussion purposes, of a first embodiment of a DSA suspension having improved PZT electrical contacts according to the present invention. In this view, the PZT elements are shown mounted on stamped tabs 18 within the base plate 3 of a hard disk drive suspension 5. Load beam 7 is connected to base plate 3 by hinges or spring 6. Spring 6 may be a separate piece of stainless steel, or it may be integral with either base plate 3 or load beam 7.

Figure 5:
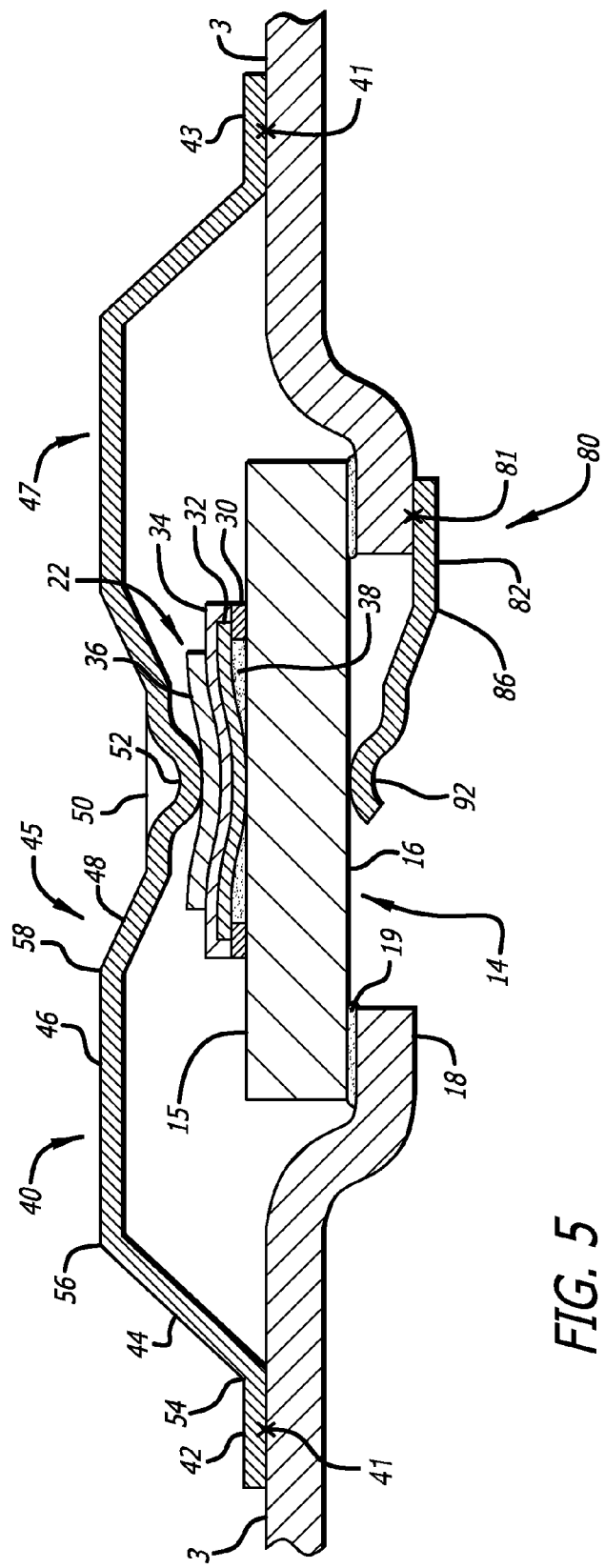
FIG. 5 is a sectional view of the suspension of FIG. 4 taken along section line 5-5.

FIG. 5 is a side cutaway view of the embodiment of FIG. 4 taken along section line 5-5 in FIG. 4. In this view, PZT 14 is seen mounted to mounting shelf 18 that has been stamped or otherwise formed into baseplate 3 which is typically stainless steel. A finger 24 of flexible circuit 20, including electrical contact pad 22, extends onto the V+ surface (positive electrode) of PZT 14, which will be referred to as the top surface 15. Electrical contact pad 22 is electrically connected to at least one conductive signal trace within flexible circuit 20 that carries a driving voltage for PZT 14. Flexible circuit 20 includes a number of conductive signal traces such as copper traces, the traces carrying both data signals for writing data to the disk platter as well as data read from the disk platter. The signal traces on flexible circuit 20 also include at least one driving voltage for driving microactuator 14.

As seen in FIG. 5, electrical contact pad 22 includes an insulating layer 30 such as polyimide, a signal trace 32 typically comprising copper or copper alloy, and finally a coverlayer 34 also called a "cover layer" or "topcoat," or the like. Bottom surface 16 of PZT may be bonded to base plate mounting shelves 18 using epoxy 19 or by other known attachment methods and at other known locations.

Figure 6:
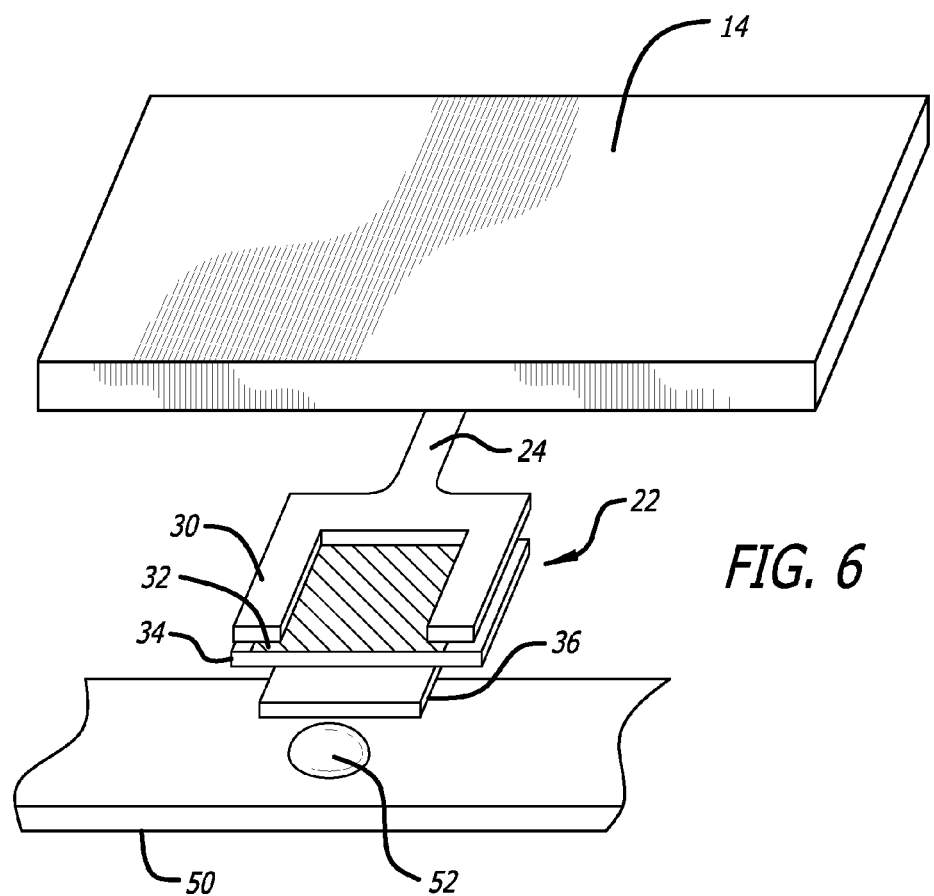
FIG. 6 is an oblique exploded closeup view of the suspension of FIG. 4 in the area around electrical contact pad 22, as viewed from the opposite direction from the view of FIG. 4.

FIG. 6 is an oblique exploded view of the area around electrical contact pad 22 in FIG. 4, taken from the reverse side. As shown in the figure, polyimide layer 30 is selectively removed from flexible circuit 20, leaving an exposed area of copper 32 that will define the copper electrical contact pad to the V+ electrode or surface (the positive electrode) of the PZT.

Returning to FIG. 5, a piece 40 of resilient material provides a bias force to mechanically bias the exposed copper 32 of electrical contact pad 22 against the PZT's V+ surface 15. Piece 40 is preferably made of stainless steel to take advantage of stainless steel's spring-like characteristics, corrosion resistance, and ease of welding to the stainless steel baseplate 3 or other part of stainless steel suspension 5. Alternatively, piece 40 could be integrally formed with, and a part of, spring 6 of FIG. 4. Piece 40 thus constitutes a biasing mechanism, spring, or hinge that biases electrical contact pad 22 against a first surface 15 of PZT 14. In the illustrative embodiment, spring 40 has a dimple 52 that is either a convex dimple integrally formed into spring 40 such as by die stamping, or can be a separate piece of resilient material that is not stainless steel and which is thereafter affixed to spring 40. Dimple 52 thus need not be of the same material as spring 40. If dimple 52 provides enough resiliency by itself, spring 40 need not itself be resilient. Dimple 52 presses electrical contact pad 22 against PZT 14, thus being the point of contact through which spring 40 presses the exposed copper contact pad 22 against the PZT surface. Preferably, spring 40 is a piece of stainless steel material having the dimple 52 formed therein, with the hinge being welded to the suspension surface such as at weld points 41 at the various loci shown. Stainless steel has good elastic deformation characteristics, making the stainless steel hinge a good spring for biasing dimple 52 against electrical contact pad 22, and hence for biasing the copper pad 32 against PZT 14. The copper contact pad 32 is electrically isolated from dimple 52 by coverlayer 34, and hence is not short circuited to dimple 52. An additional layer of mechanically strong insulating material 36 and/or additional thickness of coverlayer 34 can be introduced between dimple 52 and copper contact pad 22, to help ensure that dimple 52 does not eventually penetrate through coverlayer 34 and short circuit to the copper contact pad 32 other otherwise damage the thin layer copper layer that makes up copper contact pad 32.

In the embodiment as illustrated, spring 40 has left and right sides 45 and 47 that have respective flat base sections 42 and 43 welded to suspension 105 at weld points 41. The left side 45 includes base section 42 welded at weld point 41, bend 54 extending away from suspension 105, upwardly extending portion 44, bend 56, middle section 46, bend or jog 58, downwardly extending portion 48, and middle portion 50. Right side 47 may have similar corresponding features, not explicitly called out in the figure.

A second bias means such as spring 80 may provide the grounding electrical contact to the PZT's ground or V− surface 16. As illustrated, spring 80 includes base portion 82 welded to the suspension at weld point 81, a bend or jog 86, and a dimple 92. Dimple 92 presses up against ground or negative electrode 16, thus grounding the PZT's negative electrode through spring 80 to the stainless steel body of the suspension, in this case the stainless steel mounting shelf 18 stamped into baseplate 3. Stainless steel spring 80 thus presses against the ground surface 16 of PZT 14, providing a ground path from the PZT's ground surface or electrode to the body of suspension 5. As with spring 40 for the V+ terminal of PZT 14, spring 80 could have a single anchor point at weld point 81, or it could have a second weld point (or more) at the opposite side of the PZT. Spring 80 could provide the grounding for only a single PZT, or it could extend laterally across the suspension to provide grounding for both PZTs.

In the embodiment shown, epoxy 19 is a non-conductive epoxy. Alternatively, epoxy 19 can be a conductive epoxy or other adhesive, thus creating a ground connection for the PZT and eliminating the need for separate grounding spring 80.

The bias force by which electrical contact pad 22 is pressed against PZT 14 can be adjusted by appropriately selecting the parameters of hinge thickness, distance from the weld points to the dimple, the number of weld points, dimple height, and other parameters as will be apparent to those skilled in the relevant art to which the invention pertains. Although hinges using materials other than stainless steel could be used, a stainless steel hinge attached to the rest of the suspension by laser welding has the virtue of not introducing additional process steps due to the fact that laser welding of stainless steel is already used in the manufacture and assembly of a typical suspension.

Preferably, copper contact pad 32 is covered by a thin electrodeposited layer of gold (not shown). Such an electrodeposited layer of gold is typically already used as an anti-corrosion layer for disk drive suspension circuits and to provide high quality electrical contacts, and would therefore introduce no additional process steps. A soft gold layer would help to reduce the electrical resistance at the point of contact given a particular bias force. Alternatively, a soft gold layer would reduce the bias force necessary to achieve the same electrical conductance across the contact.

Similarly, the V+ electrode of PZT 14 is also typically covered with a thin layer of gold (not shown) both for corrosion resistance and to provide a high quality electrical connection. Providing high quality contact surfaces such as gold contact surfaces on PZT crystals such as PZT microactuators is well known in the art.

The invention therefore provides a gold-on-gold contact from the electrical circuit 20 to the PZT electrode surface, with a mechanical bias force being applied to push and hold the two gold surfaces together. According to the invention, neither epoxy nor solder, nor other types of conventionally used connection materials and techniques, need be used at that connection.

Of possible concern is the potential for fretting corrosion at the points of contact between the PZT and the circuit contact pad. The term "fretting" refers to wear and sometimes corrosion damage at the asperities (the microscopic peaks and valleys) of contact surfaces. Fretting damages is induced under load and in the presence of repeated relative surface motion, as induced for example by vibration. Vibration amplitudes as low as several nanometers have been known to cause fretting. The contact movement causes mechanical wear and material transfer at the surface, often followed by oxidation of both the metallic surfaces or other debris around the freshly-exposed metallic or other surfaces. Because the oxidized debris is usually much harder than the surfaces from which it came, it often acts as an abrasive agent that increases the rate of both fretting and a mechanical wear called false brinelling. Fretting damage could potentially occur due to relative movement caused by actuations of the PZT, as well as normal disk drive operational vibration.

The potential for fretting corrosion can be reduced by various techniques, including: increasing the bias force so that no relative movement occurs between the contacts; making the contact surfaces particularly smooth; and/or introducing a conductive lubricant 38 such as conductive and anti-corrosive grease between the contact surfaces; and other well known techniques. Fretting corrosion, materials and techniques for avoiding fretting corrosion, information relating to gold contacts in general, and other potentially applicable information is discussed in the articles and papers attached collectively as Exhibit C to provisional patent application Ser. No. 61/411,357 from which the application claims priority, and which forms a part of the instant disclosure by its incorporation by reference herein.

Figure 7:
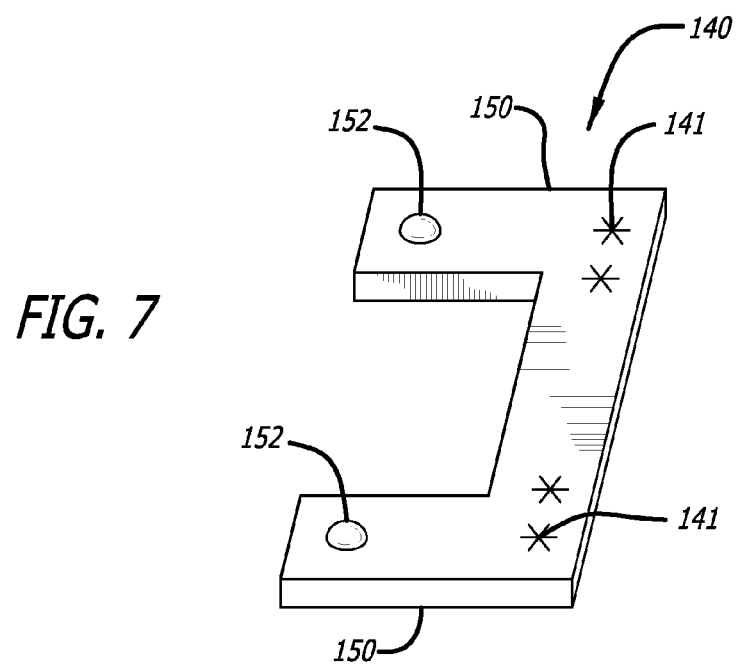
FIG. 7 is an oblique view of an alternative embodiment of a contact bias spring.

FIG. 7 shows an alternative contact bias spring 140 that could be used instead of spring 40. Spring 140 is welded to baseplate 3 such as by laser welding at weld locations 141. Spring 140 includes two spring fingers 150 with respective dimples 152. The two spring fingers 150 with their respective dimples provide the electrical contact bias force for both of PZTs 14 on suspension 5. Each of the fingers could have respective bends or a "jogs" in them, each bent finger 150 defining a spring finger that is rigidly attached to the suspension on only one side of each PZT. Spring finger 150 presses against the part of the flexible circuit that has the electrical pad 22 that contacts the PZT, thus pressing the contact pad against the PZT to define a mechanically biased contact connection. Spring 140 as drawn thus has two spring fingers 150, each of which is anchored at a single end. Alternatively, spring 140 could have a single spring which is anchored at a single end. Alternatively, spring 140 could have two spring fingers 150 each of which extends over the PZT and to the other side of the PZT, and each of which is welded to the suspension at that other side, thus defining two spring fingers each of which are anchored at both sides of their respective dimples 152 and at both sides of their respectively associated PZTs.

It will be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise. Thus, unless expressly stated otherwise, each feature disclosed is one example only of a generic series of equivalent or similar features.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. For example, PZT microactuators have been proposed to be placed at locations on a suspension other than the baseplate, and the invention should therefore not be considered to be limited to a DSA suspension having a baseplate mounted microactuator. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A dual stage actuator (DSA) type suspension for a disk drive, the suspension comprising:
    a load beam;
    a microactuator coupled to the load beam to effect fine movements thereof;
    a flexible circuit comprising a plurality of conductive traces, the traces carrying data signals and at least one microactuator driving voltage, wherein at least one of the traces of the flexible circuit is electrically coupled to an electrical contact pad that extends over the microactuator;
    a stainless steel spring welded to the suspension, the stainless steel spring providing a bias force that presses the electrical contact pad against a first surface of the microactuator, the electrical contact pad carrying a microactuator drive voltage to the microactuator first surface that causes the microactuator to expand thereby effecting said fine load beam movements;
    electrically conductive grease disposed between the electrical contact pad and the microactuator first surface;
    wherein the electrical contact pad is not connected to the microactuator first surface by soldering or by conductive epoxy, said bias force and conductive grease providing the only electrical path for said microactuator driving voltage between the electrical contact pad and the microactuator.

2. The DSA suspension of claim 1 wherein the electrical contact pad and the microactuator first surface each have gold coatings thereon, the electrically conductive grease being disposed between the gold coatings.

3. The DSA suspension of claim 1 wherein the stainless steel spring has a dimple, the dimple defining a point of contact by which the spring presses the electrical contact pad against the microactuator surface.

4. The DSA suspension of claim 3 wherein the dimple comprises a convex dimple integrally formed in the stainless steel spring.

5. The DSA suspension of claim 3 wherein the dimple comprises a resilient material that is formed separately of a material that is not stainless steel and is thereafter affixed to the spring.

6. The DSA suspension of claim 1 wherein the stainless steel spring comprises a first spring, the suspension further comprising:
    a second stainless steel spring welded to the suspension, the second stainless steel spring pressing against a ground surface of the microactuator thereby providing a ground path from the microactuator ground surface to the suspension.

7. A dual stage actuator (DSA) type suspension for a disk drive, the suspension comprising:
    a load beam;
    a microactuator coupled to the load beam to effect fine movements thereof;
    an electrical contact pad in electrical communication with a flexible circuit; and
    a bias mechanism for mechanically biasing the electrical contact pad against a surface of the microactuator, the electrical contact pad not being either soldered to the microactuator or adhered thereto by adhesive or ultrasonically bonded thereto.

8. The DSA suspension of claim 7 wherein the bias mechanism comprises a spring.

9. The DSA suspension of claim 8 wherein the spring comprises a piece of stainless steel.

10. The DSA suspension of claim 8 wherein the spring comprises a piece of stainless steel that is welded to the suspension at one or more loci near the electrical contact pad.

11. The DSA suspension of claim 7 wherein the electrical contact pad and the microactuator surface each have gold coatings thereon.

12. The DSA suspension of claim 7 wherein the microactuator is a PZT piezoelectric element.

13. The DSA suspension of claim 12 further comprising an electrically conducting lubricant between the electrical contact pad and the PZT surface.

14. The DSA suspension of claim 13 wherein the electrically conducting lubricant is an electrically conductive grease for enhancing electrical communication at the interface between the electrical contact pad and the microactuator surface, and for preventing corrosion thereat.

15. The DSA suspension of claim 7 wherein the bias mechanism provides a bias force that is sufficient such that no other mechanical or electrical connection from the electrical contact pad to the microactuator is necessary to ensure electrical connection from the electrical contact pad to the microactuator.

16. The DSA suspension of claim 7 further comprising a stainless steel spring that is welded to the suspension, the stainless steel spring being biased against a ground connection of the microactuator thereby providing a ground connection from the microactuator to a body of the suspension.

17. The DSA suspension of claim 7 wherein the bias mechanism has a dimple that presses the electrical contact pad against the microactuator surface.

18. The DSA suspension of claim 7 further comprising:
   an insulating coverlayer on the flexible circuit including on the electrical contact pad; and
   a layer of insulating material disposed between the bias mechanism and the cover layer to protect the bias mechanism from piercing the coverlayer and electrically shorting to the electrical contact pad.

19. The DSA suspension of claim 7 wherein said microactuator defines a first microactuator, and the suspension further comprises a second microactuator, wherein said bias mechanism comprises a single integral part having two spring fingers, each spring finger pressing a respective electrical contact pad against a respective one of the microactuators.

* * * * *